United States Patent
Donlin et al.

(10) Patent No.: US 7,890,916 B1
(45) Date of Patent: *__Feb. 15, 2011__

(54) DEBUGGING USING A VIRTUAL FILE SYSTEM INTERFACE

(75) Inventors: Adam P. Donlin, Los Gatos, CA (US); Brandon J. Blodget, Santa Clara, CA (US); Paul M. Hartke, Stanford, CA (US); Patrick Lysaght, Los Gatos, CA (US); Hayden Kwok-Hay So, Hong Kong (HK)

(73) Assignee: Xilinx, Inc., San Jose, CA (US)

( * ) Notice: Subject to any disclaimer, the term of this patent is extended or adjusted under 35 U.S.C. 154(b) by 434 days.

This patent is subject to a terminal disclaimer.

(21) Appl. No.: 12/055,163

(22) Filed: Mar. 25, 2008

(51) Int. Cl.
*G06F 17/50* (2006.01)

(52) U.S. Cl. ........................ 716/116; 716/106; 716/108; 716/117

(58) Field of Classification Search ................ 716/4, 716/16, 17, 106, 108, 116, 117
See application file for complete search history.

(56) References Cited

U.S. PATENT DOCUMENTS

| 6,704,889 | B2 * | 3/2004 | Veenstra et al. ............... 714/39 |
| 7,024,427 | B2 | 4/2006 | Bobbitt et al. |
| 7,127,678 | B2 | 10/2006 | Bhesania et al. |
| 7,207,041 | B2 | 4/2007 | Elson et al. |
| 7,269,696 | B2 | 9/2007 | Muhlestein et al. |
| 7,337,407 | B1 * | 2/2008 | Ogami et al. ............... 715/762 |

2003/0191810 A1  10/2003  Muhlestein et al.

OTHER PUBLICATIONS

"A Virtual File System for Dynamically Reconfigurable FPGAs", by Adam Donlin, Patrick Lysaght, Brandon Blodget, and Gerd Troeger, FPL 2004, LNCS 3203, pp. 1127-1129, @2004.*
"FPGAs & Dynamic (Re) Configruation—ongoing work", by Gerd Troger, Apr. 7, 2005.*
"Improving Usability of FPGA-based Reconfigurable Computers Through Operating System Support," by Hayden Kwok-Hay So, and Robert W. brodersen, IEEE @2006.*
U.S. Appl. No. 10/812,643, filed Mar. 29, 2004, Donlin et al.
U.S. Appl. No. 11/901,100, filed Sep. 13, 2007, Donlin.
U.S. Appl. No. 12/426,943, filed Apr. 20, 2009, Lysaght et al.

* cited by examiner

*Primary Examiner*—Paul Dinh
*Assistant Examiner*—Nha T Nguyen
(74) *Attorney, Agent, or Firm*—LeRoy D. Maunu; Lois D. Cartier

(57) ABSTRACT

Various approaches for controlling a circuit implemented on an integrated circuit device having programmable logic. According to one approach a hierarchy of directories and files are maintained in a virtual file system that is registered with an operating system. The directories and files are associated with resources of the programmable logic. Each file represents a respective data set of configuration data for an associated one of the resources, and at least one of the files is a clock control file that is associated with a clock control circuit on the integrated circuit. A first value is stored in the clock control circuit of the programmable logic in response to invocation of an operating system file access command that references the clock control file and specifies the first value. Advancement of a clock signal on the programmable logic is controlled in response to the first value stored in the clock control circuit.

18 Claims, 9 Drawing Sheets

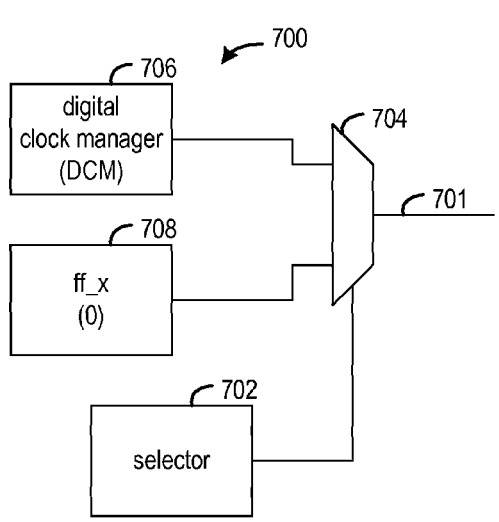
FIG. 7A
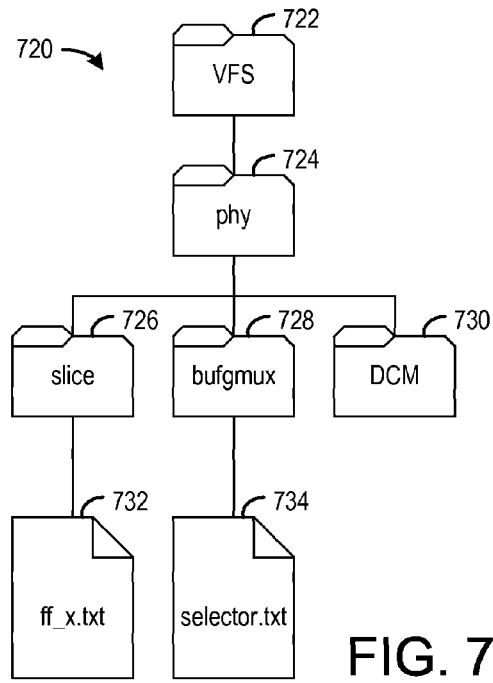
FIG. 7B
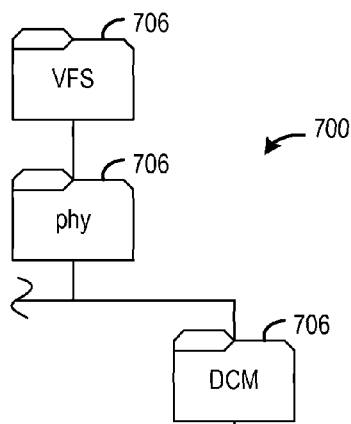
FIG. 8
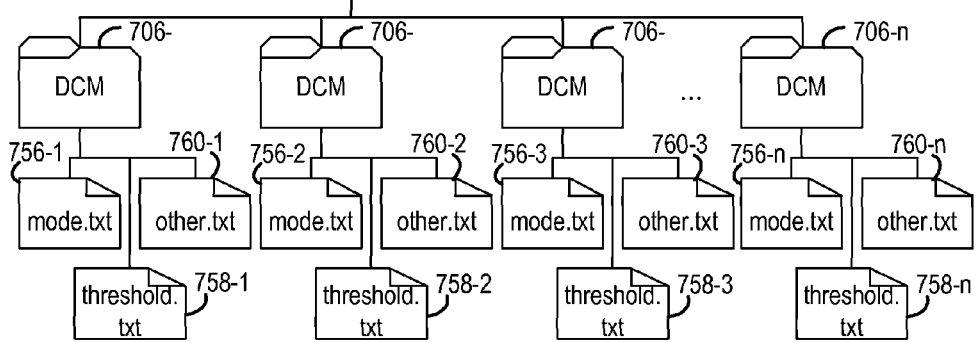

DEBUGGING USING A VIRTUAL FILE SYSTEM INTERFACE

FIELD OF THE INVENTION

The present invention generally relates to use of a virtual file system interface to control operation of an implementation of a design on a programmable logic device.

BACKGROUND OF THE INVENTION

The technology of programmable logic devices (PLDs) has progressed to a level such that it is possible to implement a microprocessor on a PLD and host an operating system such as Linux. Not only may this support various system on a chip (SOC) applications, but with the capabilities of a PLD such as a Virtex field programmable gate array (FPGA) from Xilinx, the SOC is reconfigurable to suit changing requirements or adjust to changing environmental conditions.

The configuration of a PLD such as an FPGA, generally refers to the state of the configurable logic resources of the device as programmed to accomplish a set of required functions. Data that is loaded into the device to achieve a desired configuration may be referred to as a configuration bitstream or configuration data. The state of the device generally refers to the contents of registers and memories in the device at a chosen time while the device is performing the desired functions.

In developing and maintaining a design it may become necessary to debug the design as implemented in a configured PLD. Devices such as the Virtex FPGA have various modes available for accessing the configuration data and state. For example, for general needs the SelectMap interface of the Virtex FPGA may be used to load a configuration bitstream into the device or read back configuration data from the device. For testing and diagnostic activities, a boundary scan interface may be used to establish or read back state data. The internal configuration access port (ICAP) may be implemented on a Virtex FPGA to manipulate configurable resources after the device has already been configured.

Even though these interfaces for accessing configuration data or device state are suitable for most purposes, the interfaces are low-level (less abstract) and may be unnecessarily complex for some applications. For example, to the developer of an application in which the PLD is to be re-configured while being part of a running system (run-time reconfiguration), the low-level interface may not be familiar. The developer's lack of familiarity may present scheduling, reliability, and cost issues.

In some scenarios it may be desirable to add debug logic to the design undergoing diagnosis. However, debug logic added to a design may inadvertently change the behavior of the system. In addition, PLD resources may be limited, thereby limiting use of debug logic on the device.

The present invention may address one or more of the above issues.

SUMMARY OF THE INVENTION

The various embodiments of the invention support controlling a circuit implemented on a programmable logic device (PLD). According to a method of the present invention, a hierarchy of directories and files are maintained in a virtual file system that is registered with an operating system. The directories and files are associated with resources of the PLD. Each file represents a respective data set of configuration data for an associated one of the resources, and at least one of the files is a clock control file that is associated with a clock control circuit on the PLD. A first value is stored in the clock control circuit on the PLD in response to invocation of an operating system file access command that references the clock control file and specifies the first value. Advancement of a clock signal on the PLD is controlled in response to the first value stored in the clock control circuit.

In another embodiment, an apparatus is provided for controlling a circuit implemented on a programmable logic device (PLD). The apparatus comprises: means for maintaining a hierarchy of directories and files in a virtual file system that is registered with an operating system, wherein the directories and files are associated with resources of the PLD and each file represents a respective data set of configuration data for an associated one of the resources, and at least one of the files is a clock control file that is associated with a clock control circuit on the PLD; means for storing a first value in the clock control circuit on the PLD in response to invocation of an operating system file access command that references the clock control file and specifies the first value; and means for controlling advancement of a clock signal on the PLD in response to the first value stored in the clock control circuit.

An article of manufacture is provided in another embodiment. The apparatus comprises a processor-readable storage medium configured with instructions for controlling a circuit implemented on a programmable logic device (PLD) by causing a processor to perform the steps including, maintaining a hierarchy of directories and files in a virtual file system that is registered with an operating system. The directories and files are associated with resources of the PLD and each file represents a respective data set of configuration data for an associated one of the resources, and at least one of the files is a clock control file that is associated with a clock control circuit on the PLD. The steps further include storing a first value in the clock control circuit on the PLD in response to invocation of an operating system file access command that references the clock control file and specifies the first value and controlling advancement of a clock signal on the PLD in response to the first value stored in the clock control circuit.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 7A shows an example clock control circuit that may be configured using the virtual file system files shown in FIG. 7B;

FIG. 8 illustrates the virtual file system files that may be accessed for controlling application of the clock signals from multiple clock managers;

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Embodiments of the present invention are applicable to many types of integrated circuits, including those having programmable logic. However, examples of some embodiments of the present invention are described in relation to application in Programmable Logic Devices (PLDs) such as Complex Programmable Logic Devices (CPLDs) and Field Programmable Gate Arrays (FPGAs). These exemplary descriptions are not intended to limit embodiments of the present invention, but to illuminate them in the context of very complex integrated circuits.

Figure 1:
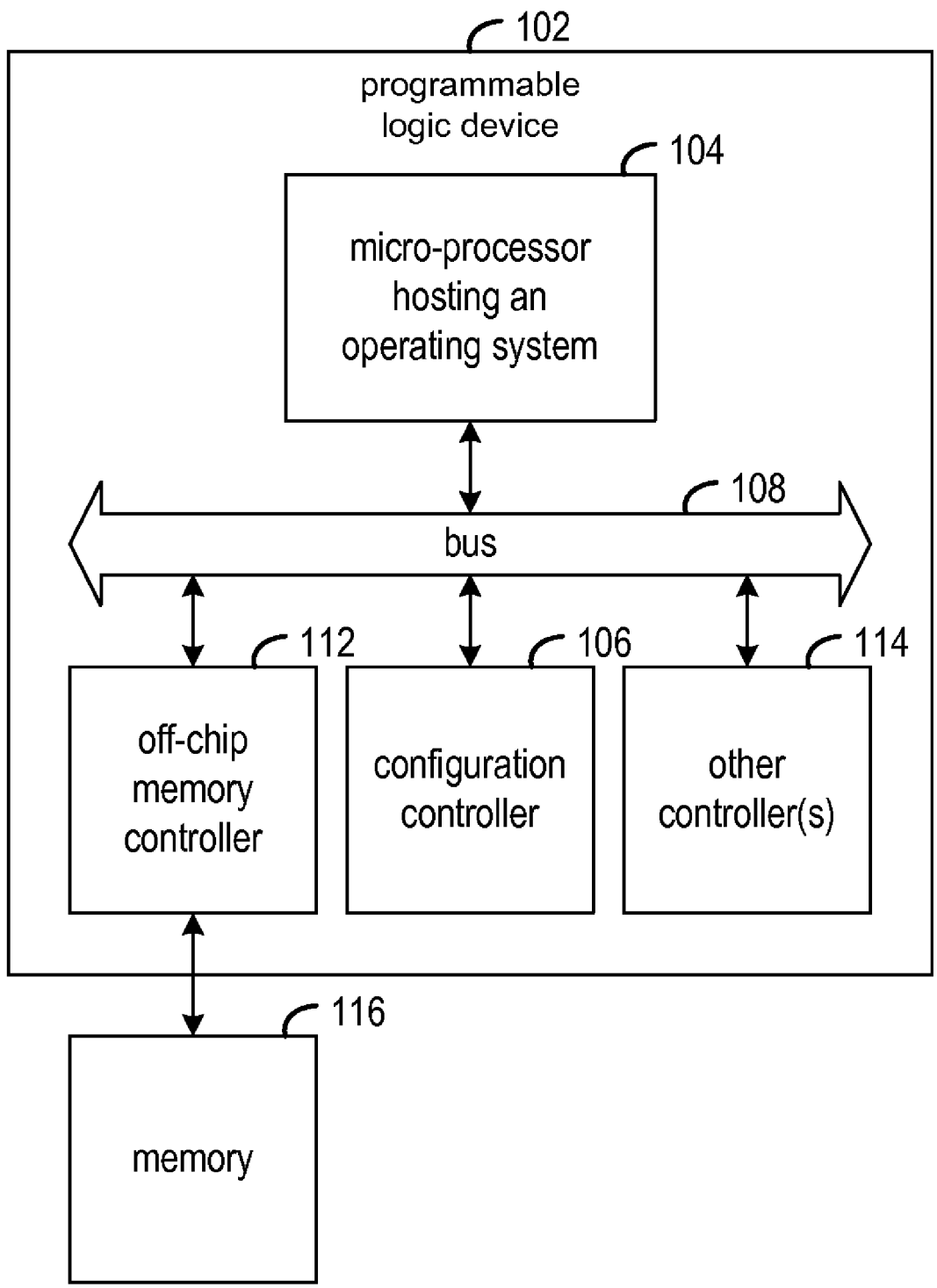
FIG. 1 is a block diagram that illustrates a programmable logic device (PLD) having implemented therein a microprocessor.

FIG. 1 is a block diagram that illustrates a programmable logic device (PLD) 102 having implemented therein a microprocessor 104. The microprocessor 104 may be implemented with the PLD logic and in one embodiment hosts an operating system, such as Linux, that supports a VFS.

In addition to the microprocessor, the PLD 102 has implemented therein a configuration controller 106 which interfaces with the microprocessor via bus 108. The configuration controller supports access to the configuration state of the PLD over general interconnect circuitry within the device. For example, in one embodiment, the PLD 102 is a field programmable gate array (FPGA) such as a Virtex FPGA from Xilinx, Inc., and the configuration controller may be implemented with the internal configuration access port (ICAP).

ICAP is a configuration method that is available to the internal logic resources after the device is configured. The ICAP block exists in the lower right corner of the array and is similar to the SelectMAP configuration protocol from Xilinx. ICAP supports partial reconfiguration of the device and bus interfaces such as the peripheral component interface (PCI) may be provided by a soft wrapper core placed around the ICAP interface. The wrapper core implements the complex bus protocol and propagates data to and from the actual ICAP interface as needed.

Depending on application and implementation requirements, the PLD may be configured with additional controllers, for example, controllers 112 and 114, that provide access to off-chip resources. For example, controller 112 may be a memory controller that provides access to memory 116. It will be appreciated that a variety of commercially available or proprietary memory architectures and interfaces may be used to implement the memory controller and memory. Other types of controllers, illustrated by block 114, may provide network or communications interfaces and access to retentive storage systems such as tape drives and disk drives.

The various embodiments of the invention provide access to configuration data of a PLD via a virtual file system (VFS). An operating system such as Linux supports virtual file systems (VFSs). VFSs allow user-space applications to access the selected ones of the operating system kernel's data structures via basic file I/O operations or function calls. From the perspective of a user-space application, access is made to the configuration data by calling the same file system routines as are called for accessing a file on a storage media such as a disk. However, the access is actually to a data structure in the kernel's memory. In various embodiments of the present invention, access is to the actual configuration data of configurable logic resources of an FPGA or state data of memory cells in the FPGA. It may in general be desirable to access the FPGA configuration data and state data directly rather than caching the data in kernel memory.

Figure 2:
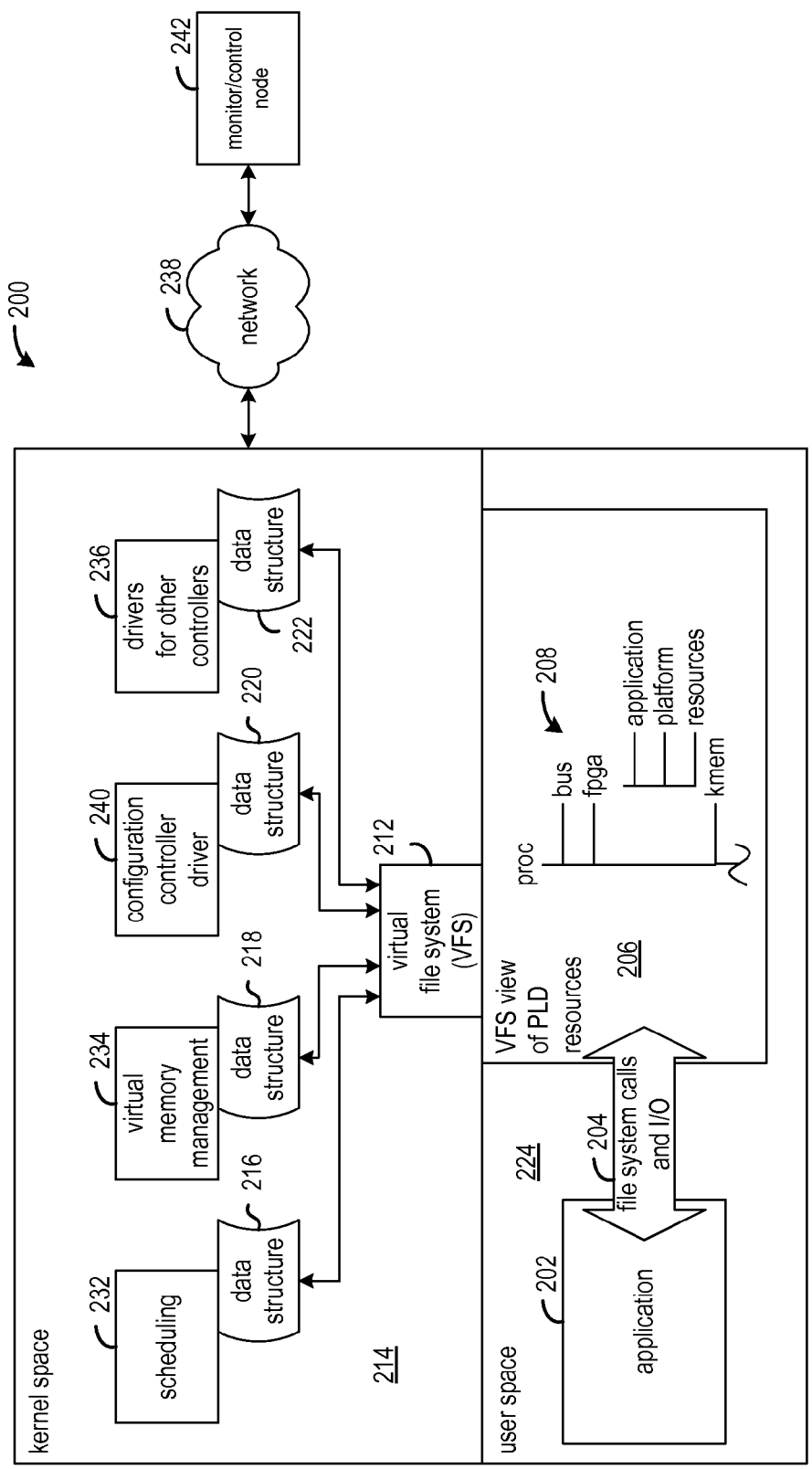
FIG. 2 is a functional block diagram that illustrates a system in which the configuration of a PLD is made accessible via a virtual file system.

FIG. 2 is a functional block diagram that illustrates a system 200 in which the configuration of PLD resources is made accessible via a virtual file system. The application need not directly interface with the configuration controller driver. Instead, the application may make file system calls to the VFS extension, which hides the complexity of the configuration controller from the application.

In an example embodiment, an application program 202 makes file system calls 204 that reference the VFS-implemented view of the PLD resources 206. The PLD resources are represented in the VFS by the LINUX /proc file system in an example embodiment. The application view of the representation is shown as the directory hierarchy 208.

The example directory hierarchy 208 shows an FPGA directory along with example bus and kmem directories. The bus and kmem directories illustrate additional kernel-managed resources that may be accessible via a VFS. An FPGA is used as an example of a PLD whose configuration data may be made accessible via the VFS. The configuration data of the FPGA is organized into directories that represent the data by application, by platform areas, and by resources, as shown in more detail in FIGS. 3A-3D. It will be appreciated that the application subdirectory under the FPGA directory relates to the application implemented on the FPGA as compared to the application 202 which may manipulate the FPGA configuration data.

The VFS 212 operates in kernel memory space 214 and provides access to kernel data structures 216, 218, 220, and 222 for application 202, which operates in user memory space 224. The VFS is accessible to the application via file system calls, and the VFS interfaces with the respective kernel components or drivers that manage the referenced data. Example components and drivers in the kernel include a scheduling component 232, a virtual memory management component 234, and other drivers 236 for interfacing with other data structures. The other drivers may include, for example, drivers for interfacing with data communications network 238.

In one embodiment, driver 240 provides VFS access to the configuration controller 106 (FIG. 1). The data accessed by driver 240 is the configuration state of the FPGA as referenced by the parameters in the file system calls made by application 202.

In another embodiment, the driver 240 may be invoked from a network-connected node 242 for controlling or monitoring the FPGA configuration state. This may allow a remote system to maintain a higher-level directory structure that represents the configuration data for all the PLDs that are deployed and managed by the node. Opening a directory/file at node 242 would transparently invoke network file system protocols within node 242 and the file system implemented on the PLD would act as a client. An example use of the network-connected embodiment may involve determining differences between the configuration data of separate PLDs in order to diagnose problems. Standard tools may be used with the embodiments for revision control and archiving of configuration data.

It will be appreciated that in yet another embodiment, the network-connected node 242 could implement the VFS view of directories and files of configuration data instead of the PLD implementing the file system logic.

Figure 3A:
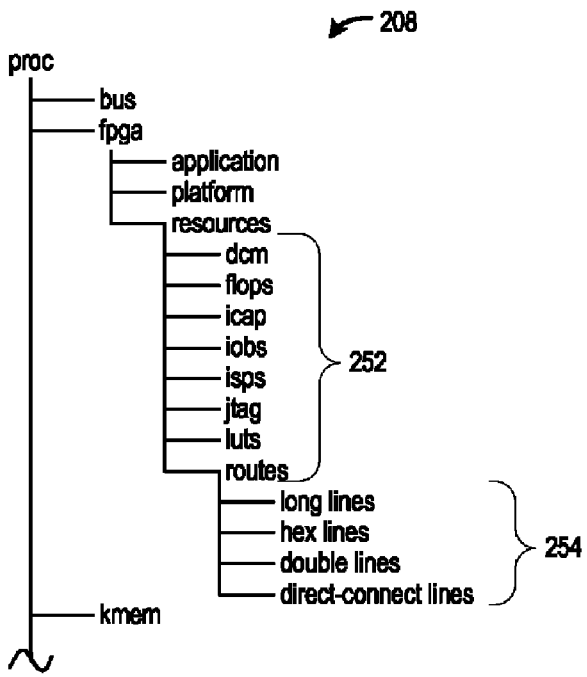
FIGS. 3A, 3B, 3C, and 3D illustrate examples of various alternative hierarchies of directories and files that are associated with configuration data of an FPGA.

FIGS. 3A, 3B, 3C, and 3D illustrate various alternative hierarchies of directories and files that are associated with configuration data of an FPGA. FIG. 3A shows configurable resources of the FPGA for which the configuration data may be modeled as files in a directory hierarchy. The resources directory includes sub-directories for a digital clock manager ("dcm"), FPGA flip flops ("flops"), internal configuration access port ("icap"), input/output blocks ("iobs"), instruction set processors ("isps"), boundary scan architecture ("jtag"), look-up tables ("luts"), and routing resources ("routes"). The class of configuration data is modeled as directories 252.

Within each of directories 252 are further directories or files that represent the configuration data of the FPGA for the resources identified by the directory. For example, the routes directory contains directories 254 for routing resources of the FPGA, including "long lines", "hex lines", "double lines", and "direct-connect lines" directories. Each of directories 254 may contain a directory or file for each instance of the specific routing resource.

Figure 3B:
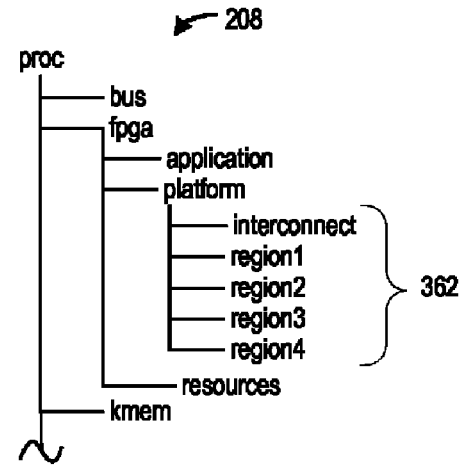

The platform view shown in FIG. 3B illustrates modeling of FPGA configuration data by region of the device. The example includes directories for four example regions, region1, region2, region3, and region4. In addition, the platform directory includes a directory named, interconnect, for routing resources that connect the regions. Under each of the region directories, region1, region2, region3, and region4, a file represents the configuration data for resources within an area of the FPGA associated with the directory. For example, the device may be viewed as having resources in 4 quadrants, each region directory may be a associated with one of the quadrants.

In an example embodiment, the files within each region may also be used to store statistical information pertaining to the region. For example, a file may contain information that indicates the spatial utilization of the region. The total area of the region is communicated to the VFS device driver in a configuration file or by kernel module options. The configuration file may be communicated to the VFS device driver by way of a "sym" file handle. A sym file handle is a portal to an interpreter implemented in the VFS driver to which the configuration file may be written. In response, the VFS takes note of the information contained in the configuration file and applies whatever corresponding actions are necessary. Sym files may also be used to communicate which regions exist, the names of the cores, where the registers are placed, and the symbolic names of the registers, for example. This allows the VFS to establish a directory hierarchy for an application with the appropriate directory names and files within those directories.

The spatial utilization of the region may be determined by the VFS module monitoring which parts of the configuration data are affected during configuration. In another embodiment, the configuration data may be accompanied by a configuration mask that could be parsed to reveal the same utilization information. The files could also be used as portals through which new configuration information could be placed into the region. Furthermore, if two regions were compatible at a physical level, the file from one region directory could be copied to the other region directory, resulting in a partial configuration bitstream being loaded into the region of the FPGA associated with the target directory.

Figure 3C:
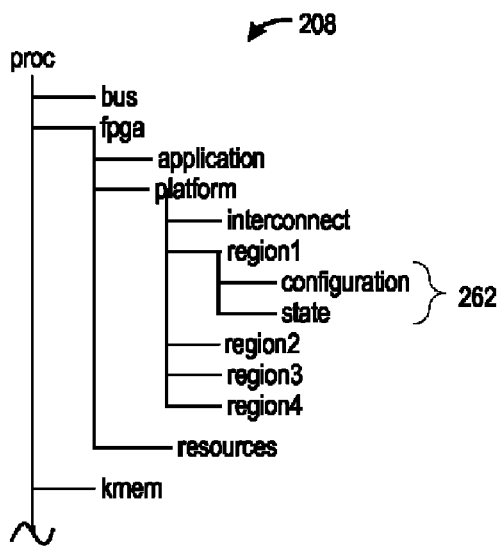

In yet another embodiment, the configuration data associated with a region directory may be further organized by configuration data and state data as shown in FIG. 3C. Configuration data refers to the state of resources of the FPGA that are programmable to implement a desired function, and state data refers to the state of elements of the FPGA that may be subject to change while the FPGA is performing its programmed functions, such as flip flops, registers, and memory. Each region directory may have separate directories for each of the configuration and state data, as illustrated by directories 262 under the directory, region1. It will be appreciated that each region directory may have configuration and state files instead of further subdirectories (entries 262 could be files instead of subdirectories).

Figure 3D:
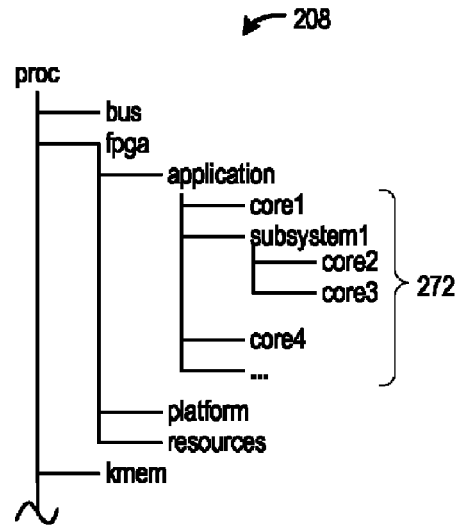

FIG. 3D illustrates example core and subsystem subdirectories 272 under the application directory. Under the application view, there are subdirectories for the constituent cores and subsystems implemented on the FPGA. For example, the application directory in FIG. 3D includes core directories, core1 and core4, along with a subsystem directory, subsystem1, which further includes sub directories, core2 and core3. The files under each core or subsystem directory may represent the registers in the core. Each file representing a register could be interrogated by opening and reading from the file or modified by writing to the file. The behavior of a core may be modified, to the extent allowed by the core, by reprogramming the registers via the file system calls to update the necessary file(s).

In another embodiment, each core directory may further include subdirectories that map to the levels in the application hierarchy (such as that created with a design tool). A file representing the configuration of a part of the core's design hierarchy could be moved or copied to the corresponding level in the core's directory within the VFS directory hierarchy. The file acts as a configuration portal, and overwriting the file substitutes that part of the application design hierarchy with alternative functionality. It will be appreciated that the configuration data that implements the alternative functionality must fit within the same physical region of the FPGA as that region in which the original functionality is implemented.

In support of manipulating configuration data under the application view, symbol data is provided to the driver of the configuration controller. The symbol data enumerates the core's name, type, constituent registers and physical locations, along with design information that describes the logical and physical hierarchy of the design. This information may be provided to the driver via a file in the application directory when the application 202 (FIG. 2) begins executing, and the driver populates its internal data structures with this information.

Figure 4:
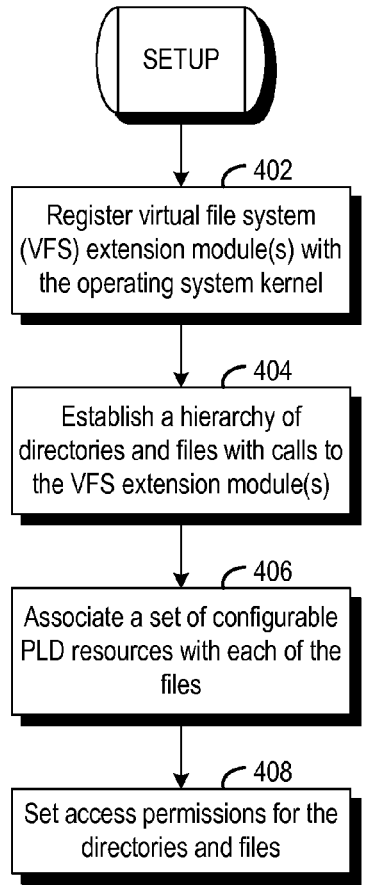
FIG. 4 is a flowchart of an example process for establishing a hierarchical directory and file view of PLD resources in accordance with various embodiments of the invention.

FIG. 4 is a flowchart of an example process for establishing a hierarchical directory and file view of PLD resources in accordance with various embodiments of the invention. The process begins with registration of modules that extend the VFS with the operating system kernel (step 402). Registration informs the kernel that a module exists and may be loaded when the module is to be used and unloaded when use of the module is complete, such as for dynamically linked libraries (DLLs). The particular mechanism by which modules register with an operating system may vary for different types of operating systems. Alternatively, a module may be statically compiled with the kernel.

An application may then make file system calls to establish a hierarchy of directories and files that represent the configuration data of the PLD (step 404). In another embodiment of the VFS, the hierarchy of directories is created by the VFS module when the module is first loaded. As noted below, in the dynamic version of the VFS, the files and directories are created by the VFS in response to the application doing a 'cd'/'ls', etc. in the VFS directory space. The file system routines in turn call the VFS extensions, which create the directories and files. In making the file system calls, configurable resources of the PLD are associated with the directories and files (step 406).

File system access control and file locking may also be implemented for the directories and files that represent the configuration data of the PLD. This functionality is typically provided by the kernel system code rather than the VFS extensions. In one embodiment, the configuration controller driver 240 (FIG. 2) may set owner and access permissions for given files and directories (step 408).

It will be appreciated that the actions of the process of FIG. 4 may be performed somewhat differently when the concepts of the present invention are implemented on different operating systems.

In an alternative embodiment, the directory and files may be created on demand. That is, parts of the directory hierarchy are generated only when needed. For example, in a VFS, directories and files may be generated as a process begins execution and deleted when the process exits. In one embodiment, when an application changes a view to a particular directory (e.g., the "cd" command in LINUX) the VFS dynamically creates the file system data structures to represent the required resources. In one embodiment, the required resources are hard coded into the implementation of the VFS module. In another embodiment, a configuration mask file may be used to only create the subset of files representing the resources used by the current FPGA configuration.

Figure 5:
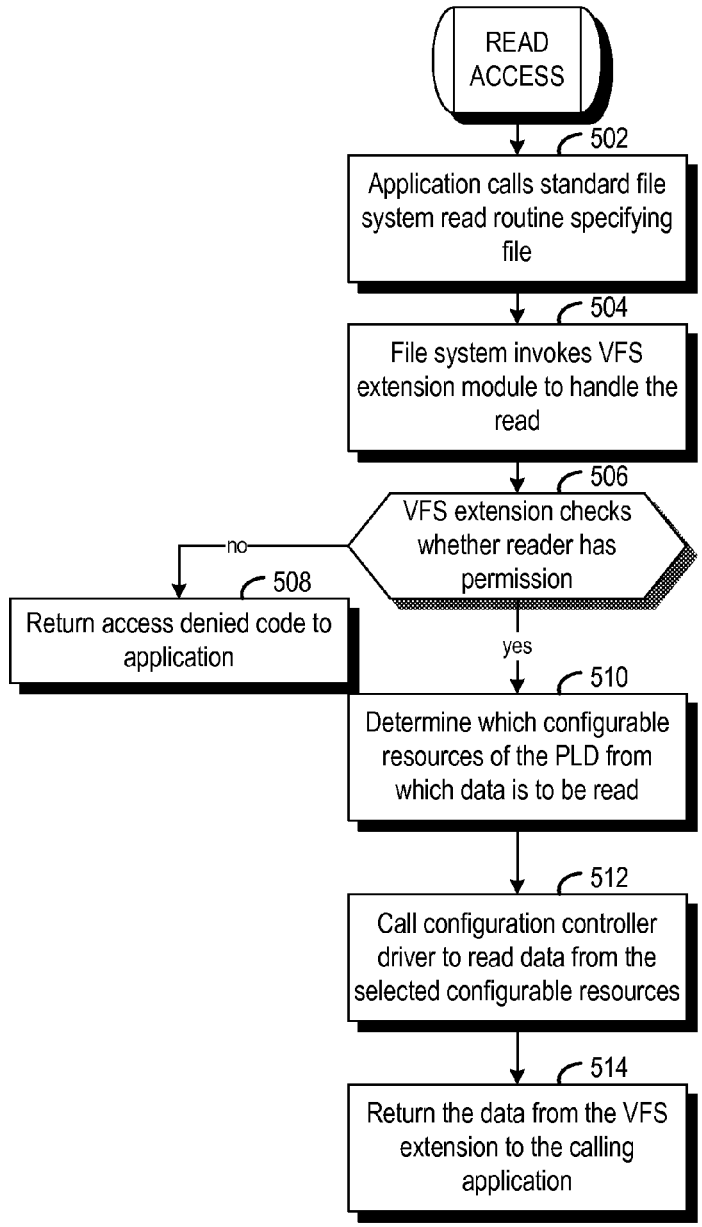
FIG. 5 is a flowchart of an example process for providing read access to data of a PLD via the hierarchical directory and file view of the PLD resources.

FIG. 5 is a flowchart of an example process for providing read access to data of a PLD via the hierarchical directory and file view of the PLD resources. To read configuration data, an application calls a standard file system routine to read a designated file (step 502). The file system in turn calls the VFS extension module for reading configuration data (step 504).

The extension module checks whether the application has permission to read the specified file (or directory) (step 506). If the application lacks permission, control is returned to the calling application with a code that indicates access was denied.

If the application has the requisite permission, the VFS extension modules determines from which configurable resources of the PLD the configuration data is to be read (step 510). This information may be obtained from the configuration controller driver data structures 220 (FIG. 2). The configuration controller driver is then called to read configuration data from the appropriate resources of the PLD (step 512), and the data is returned from the VFS extension to the calling application (step 514).

Figure 6:
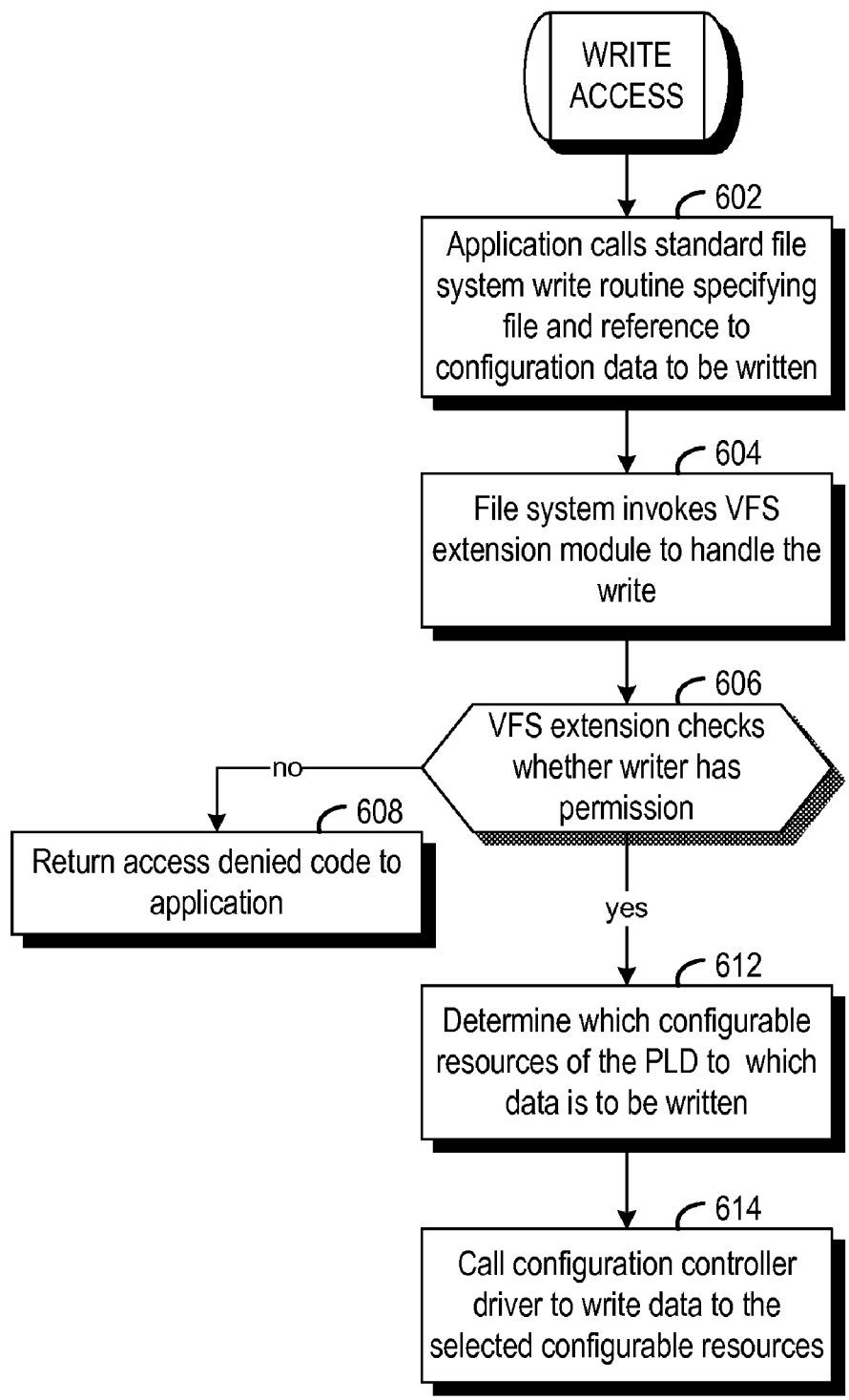
FIG. 6 is a flowchart of an example process for providing write access to data of a PLD via the hierarchical directory and file view of the PLD resources.

FIG. 6 is a flowchart of an example process for providing write access to data of a PLD via the hierarchical directory and file view of the PLD resources. The write process of FIG. 6 is similar to the read process of FIG. 5, with the difference being that a write operation is performed instead of a read operation.

For both the read and write processes, access to the configuration data may be controlled by way of execute permissions that are associated with executable files. For example, the configuration controller driver 240 may provide customized, executable files that manipulate the other data files available in the subdirectory tree. The executable files may be shell scripts, binary code, or the opening of a file with execute permission may be intercepted and interpreted as a request to perform the operations specified by the file.

In yet another embodiment, the contents of an executable file may be associated with redirecting control flow into the VFS module code itself. The module then performs the specific behavior represented by the given file in response to the user-space request to open the file for execution. The VFS, internally, may schedule the execution of some specific method defined within the VFS driver code. The invoked executable file immediately returns control to the caller. This mechanism is similar to invoking wrapped system calls except actual operating system calls (e.g., UNIX sys or files system calls) are not being invoked. The methods are specific to the VFS's control of the FPGA.

Still further file-based operations may be used in manipulating PLD configuration data. For example, operations on special file types, such as named and anonymous pipes, may be used to trigger functions of the configuration controller driver 240. One example operation is the creation of a named pipe. The actions performed by the VFS extension modules depend on the part of the directory structure (e.g., 208) in which the pipe is created. For example, the VFS extensions may alter the configuration of the portion of the PLD associated with the interconnect file in the platform subdirectory when a named pipe is established between the two regions. Symbolic link files may be interpreted by the VFS extensions for a similar purpose. The difference between named pipes and symbolic link files is that the operating system may create a process for a named pipe, where as the symbolic link is a static object in the file system.

Additional system routines may be defined to operate on the files that represent PLD configuration data. An example is a routine that freezes or halts the PLD. This routine may be needed because it may take hundreds of system clock cycles to read back data from a region of PLD. During this time the states of flip flops, registers, and look-up table RAM may be changing. Thus, a halt routine may be needed to disable the clock to a selected region of the PLD. While the clock is halted, the configuration and state data may be read from the device. A routine that resumes the clock may also be implemented.

In yet another embodiment, the VFS may be configured to mount (the mount function being provided by the host operating system) a bitstream file rather than manipulating the data of an actual FPGA. In this embodiment, the VFS code causes the configuration controller driver to manipulate the data of another file as if it were an actual, live FPGA configuration memory. In this embodiment, the low level function calls of the VFS driver manipulate the contents of a file in some other standard file system, even though to the user of the VFS the appearance is that actual configuration memory of an FPGA is being manipulated.

The bitstream file is a file that is ready for downloading to the FPGA for configuring the device. The VFS may contain low level routines that emulate the memory of the FPGA such that the bitstream data is parsed into the correct, emulated memory cells. Updates are made to the bitstream file by way of actions on the files in the hierarchy.

As described above, the VFS represents configuration data for a PLD as a hierarchy of files and directories that appear in a user's computer system. When the user reads or writes to a VFS file, the VFS manipulates the PLD configuration and/or stored configuration data associated with that particular file. The mapping of VFS files to PLD configuration data is determined by the VFS. In a physical view, one file represents one physical resource in the PLD. For example, in an FPGA each lookup table (LUT) is represented by a distinct file. The VFS uses file system directories to organize the LUT files so that the user can browse to find a specific LUT file. Similarly, physical resources such as Flip Flops, block RAMS (BRAMs) and even complex, fixed-function (but configurable) cores, such as multi-gigabit transceivers (MGTs) are represented by a file in the appropriate part of the VFS directory hierarchy.

As explained above, the core view directory contains files that are aggregates of configuration data from more than one physical resource. For example, the program counter register for a microprocessor is a single file in the VFS microprocessor core view, although it actually contains the configuration data of more than one flip-flop.

The VFS disclosed herein makes it convenient to do system debugging by controlling clocking of the system, applying test vectors, and monitoring the state of the a system through the PLD configuration memory. There are two important advantages to using the VFS for this purpose. First, it gives broad visibility into the user's system. Second, the logic required to support the VFS in the user's system can be very small. This is important when user designs are resource constrained or the presence of debug logic can actually change the behavior of the system.

In accordance with an example embodiment, the clocking is controlled by way of a clock control file that is associated with a clock control circuit on the FPGA. The clock control circuit on the FPGA may be controlled by the user by using file access commands to access the clock control file that is associated with the clock control circuit. For example, in response to a user-initiated command that writes a value to the clock control file, the VFS invokes driver software that stores a value in the clock control circuit on the FPGA. The clock control circuit is responsive to the stored value and controls advancement of the clock accordingly. For example, the controlling of advancement may be to stop application of clock signal to the system, allow the clock signal to pass to the system without controlling the number of cycles of the clock signal applied, or applying a specified number of cycles of the clock signal to the system.

FIG. 7A shows an example clock control circuit that may be configured using the VFS files shown in FIG. 7B. The example circuit 700 supports the capability of controlling the starting and stopping of the cycles of clock signal 701 that is applied to the system. Selector 702 may be implemented using a flip-flop that controls the selection by multiplexer 704 of either the clock signal from the digital clock manager 706 or the constant logic level 0 configured in flip-flop ff_x 708.

The clock circuit 700 and associated VFS directories and files 720 in FIG. 7B are associated with an example FPGA-based implementation. The top-level VFS directory 722 is illustrated with the physical view subdirectory 724. The directory names in FIGS. 7B, 8, 10, and 11 illustrate a naming and slightly modified organization of directories and file names relative to the example embodiments illustrated in FIGS. 3A-3D. In FIGS. 7B, 8, 10, and 11 VFS is a top-level directory. At a conceptual level and for purposes of describing the various embodiments of the invention the organizations are equivalent.

Under the physical view, there are directories 726, 728, and 730 for FPGA resources including a slice, bufgmux, and Digital Clock Manager (DCM), respectively. Those skilled in the art will recognize bufgmux and DCM as being resources of Virtex FPGAs from Xilinx. Under the slice directory 726 is a ff_x.txt file 732 that corresponds to and is associated with the flip-flop 708 in FIG. 7A. Similarly, the selector.txt file 734 under the bufgmux directory 728 corresponds to and is associated with the selector 702. By writing the appropriate value into the selector.txt file, the user controls whether cycles of the clock signal from the DCM 706 are propagated. The flip-flop that implements selector 702 may be a discrete flip-flop, placed in user logic and routed to the select input of the bufgmux. Alternatively, a memory cell within the configuration space of the bufgmux may be exported as a discrete file. The file access commands listed below illustrate the turning on and turning off of the clock signal 701 to the system.

cmd>echo '1'>/fpga/phys/slice/x[n]/y[m]/ff.x # turn the clock on cmd>echo '0'>/fpga/phys/slice/x[n]/y[m]/ff.x # turn the clock off In another embodiment, the clock signal to the system may be controlled by advancing the clock signal for a number of cycles specified by a value specified in a file access command. The advancing of the clock signal allows the specified number of cycles of the clock signal to be applied to the system and then suspending application of further cycles of the clock signal.

Two example embodiments are presented for advancing of the clock signal by a specified number cycles. According to one embodiment, parameters are provided to a special executable mode VFS file for cycle stepping the clock signal. In response to invoking the file by the user with the correct parameters, the executable instructs the corresponding debug logic for clock stepping to strobe the target clock for the specific number of cycles. It will be appreciated that the debug logic for clock stepping is a circuit implemented in conjunction with the user's system. For example, the selector 702 in the circuit 700 of FIG. 7A may be modified to include a counter that counts cycles of clock cycle 701 and a register for storing the user-specified cycle count. Once the counter has counted the specified number of cycles, the output of ff_x 708 is selected at multiplexer 704. The executable file may be stored under the core/debug/clocks directory. The example command below invokes the executable file, gclk1_cycle_step exe, with a parameter of 100 that specifies 100 cycles.

/fpga/core/debug/clocks/gclk1_cycle step.exe 100 # Strobe Gclk1

According to a second embodiment, the user may write to a single file that represents the threshold register of a cycle step counter circuit in user logic. For example, using a file access command the user may write the desired number of cycles to the file. The VFS responds by writing the specified number to a control register of the clock step counter circuit and the underlying circuit responds by applying the specified number of cycles. The clock step counter circuit may be implemented by modifying selector 702 as described above. The example command below writes the value 100 to the file, gclk1_thres, which corresponds to a register in the clock step counter circuit.

echo "100">/fpga/ip/debug/clocks/gclk1_thres # Strobe Gclk1

In an example embodiment, the cycle count circuit samples the threshold register periodically and activates the clock when it detects a non-zero value in the register. To accommodate situations where the state bits of the threshold register are not present in a single configuration frame, a separate enable bit may be tagged into the MSB of the threshold register file or exported as a distinct enable-bit file. When the prescribed number of clock cycles have been propagated to the target clock tree, both registers are reset.

In modern PLDs such as FPGAs for example, a DCM embedded in the FPGA architecture provides broad control of clocking functionality to the logic designer. Logic designs often employ more than one clock domain. A multi-clock control mechanism for debugging may consume too many resources to be feasible to be implemented in user logic may. The following two embodiments allow the VFS to control circuits that use more than one clock.

In one embodiment, multiple clock management circuits of a PLD may be controlled via the VFS. The VFS files include clock control files that are associated with and correspond to clock control circuits, which are coupled to the clock management circuits. To control each of the clock management circuits, the VFS stores a value in a register, for example, in response to the user invoking a file access command multiple times with the same value targeted to the different clock control circuits. Each of the clock control circuits then controls advancement of the respective clock signal from the clock management circuit as described above.

FIG. 8 illustrates the VFS files 750 that may be accessed for controlling application of the clock signals from multiple clock managers. In one embodiment, the cycle-step control functions, described above, are integrated directly into each DCM. The VFS physical view contains a main DCM directory 752 and a series of DCM sub-directories 754-1 ... 754-n. The files 756-1 ... 756-n and 758-1 ... 758-n may be accessed to control the cycle-stepping features of the DCMs. For example, to cause a DCM to cycle step its output signal the mode is changed from "free running" to "cycle stepping" and the desired number of cycles are written into the VFS file representing the DCM threshold register as shown by the example commands below for a single DCM.

cat /fpga/phys/dcm/dcm0/mode.txt

DCM0: Free Running cat "cycle step">/fpga/phys/dcm/dcm0/mode.txt cat /fpga/phys/dcm/dcm0/mode.txt DCM0: Cycle Stepping cmd>echo "100">/fpga/phys/dcm/dcm0/thres_reg # Strobe Gclk1

The files 756-1 ... 756-n and 758-1 ... 758-n represent standard configuration options for the DCM. In processing the file access commands, the VFS writes the specified data values to configuration memory on the FPGA using normal configuration channels. Once a DCM has been configured, the DCM continues operating according to the new configuration data values.

The properties of the actual clock signal generated by a DCM may also be configured via the VFS. For example, each DCM is configurable to de-skew an input clock signal and provide an output clock signal from the de-skewed input clock signal. Each DCM is also configurable to change the frequency of an input clock signal and provide the output clock signal at the changed frequency. This is useful for designs that are particularly susceptible to the physical and electrical properties of a clock signal. The VFS DCM files allow the diagnostic engineer to change the clock properties without requiring a full implementation cycle for the design. In an example use case a diagnostic engineer may need to troubleshoot a memory controller that appears to be malfunctioning. The diagnostic engineer may use the VFS files to apply slightly different phase offsets to the DCM. Executing a standard memory test program between each parameter manipulation allows the engineer to calibrate the memory controller's clocking resources to the physical requirements of the DRAM module on the PCB. There may be separate files, shown collectively as files 760-1 ... 760-n, under the DCM directories 754-1 ... 754-n for the different configuration parameters.

In addition to controlling multiple DCMs, the embodiments of the invention provide control over cycle stepping logic that operates in more than one clock domain. For troubleshooting multi-clock domain designs, it may be desirable to cycle step all of the required clocks while maintaining the correct phase and frequency relationships between the clock signals. To accommodate this, the notion of "universal time" is used when referring to clock edges or other events in the multi-clock domain design. The notion of an "epoch" is used to represent a discrete point in the future, relative to the current time instant measured in universal time. Universal time is used to represent timestamp attributes for VFS files.

Figure 9:
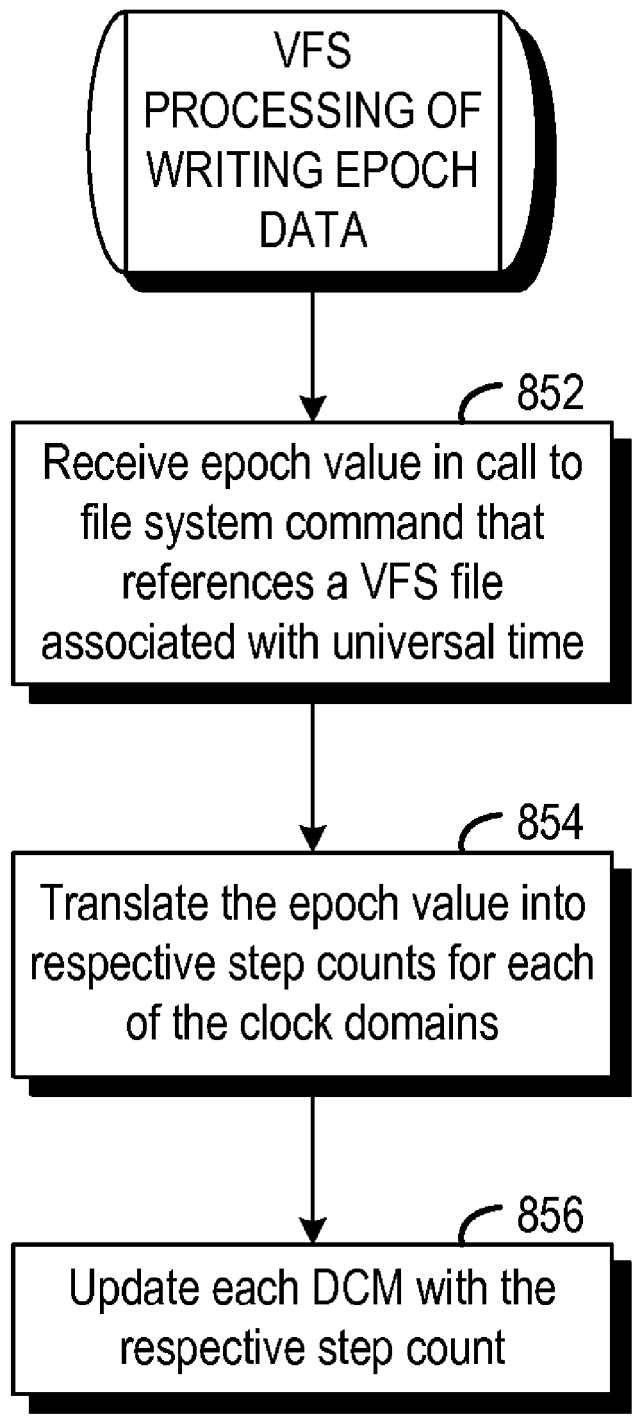
FIG. 9 is a flowchart of an example process for processing epoch time data specified by a user in a file access command.

FIG. 9 is a flowchart of an example process for processing epoch time data specified by a user in a file access command. A diagnostic engineer may write epoch data to VFS files to specify the duration for which a multi-clock domain design should run. The VFS receives an epoch value in a file access command entered by the diagnostic engineer at step 852. The file access command references a file that is associated with the DCM in one clock domain of the design. The VFS automatically translates the epoch value specified in universal time to a specific step count for the target clock domain at step 854.

The VFS calculates the cycle count for the specific clock by considering the timing properties of the clock being stepped. This information can come from the DCM configuration itself, as may be augmented with extra design flow data provided in a meta-data file ("meta-file") for the global clock. The VFS also maintains information descriptive of the current value of universal time, such as measured against some reference clock, for example, and specified in a meta-data file associated with the design or core view of the design. With this information the universal time is translated into clock cycle and phase offsets for the target global clock.

At step 856, the VFS writes the calculated step counts to the parameter register in the DCM. To control all the clock domains, the diagnostic engineer writes the same epoch value to the VFS files that correspond to the DCMs of the different clock domains. The DCMs respond by applying the specified number of clock cycles to the portions of the design. Additional hardware support may be desirable to coordinate the phases of the clocks as the clocks are stopped and started. Since clocks in a design do not necessarily operate at harmonic frequencies, it may be possible that a debug event may occur between clock edges of one of the clocks used in the design. Thus, it may be desirable to have hardware control over stopping all clocks at the correct phase in order to observe the actual state in the registers at the chosen epoch. Similarly, it may be desirable to restart clocks in the design without violating the design's jitter tolerance.

For iterative debugging, a sequence of epoch data may be desirable. Each epoch represents each incremental step through a debug scenario. However, the relationship between the universal time values used to specify each epoch and a logical event in the design being debugged may not be intuitive to the diagnostic engineer since logical events occur relative to their local clock and may have an arbitrary frequency and phase relationship to the clock source used to determine universal time.

Figure 10:
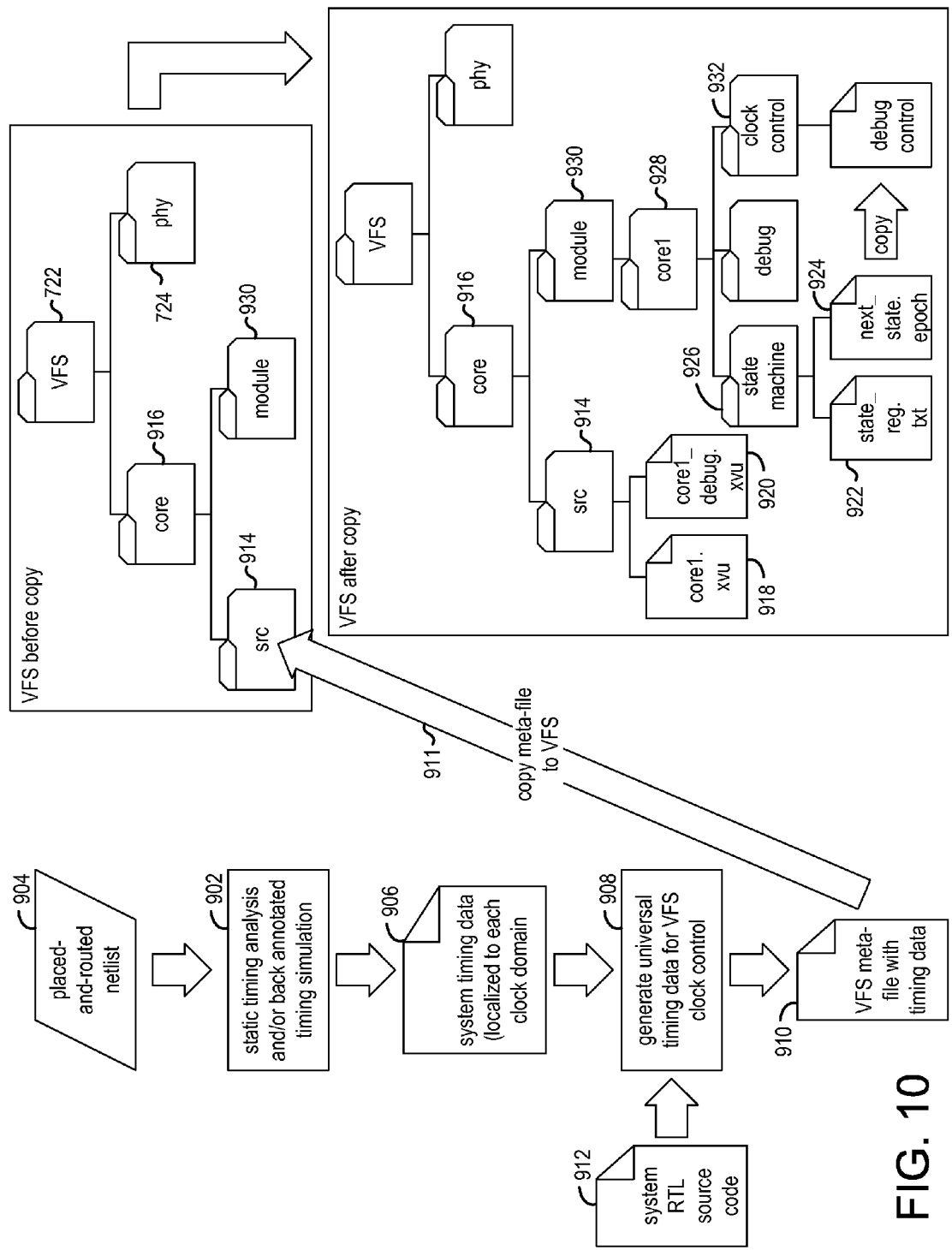
FIG. 10 illustrates a data flow for constructing a sequence of epoch data in accordance with an embodiment of the invention.

FIG. 10 illustrates a data flow for constructing a sequence of epoch data in accordance with an embodiment of the invention.

To simplify use of epoch data the VFS provides pre-calculated epoch data files. These files may be derived directly from back annotated timing simulations or static timing analysis (block 902) of a placed-and-routed netlist 904 that describes the target system. For example, static timing analysis of a placed-and-routed state machine block yields exact timing data for that block and its local clock. Thus, the analysis provides system timing data that is localized to each clock domain (block 906). The extracted local timing data 906 is processed (block 908) to convert it to a universal time epoch and added to a meta-file 910 that describes events that occur in the design. In one embodiment, the timing data is a mapping of the symbolic name of the state and the timing data required for the state machine to advance to that state from the current state. The RTL source code is analyzed to recover the symbolic names of the different states of the state machine and the sequence in which they can be activated.

To use the timing data in constructing epoch data files, the diagnostic engineer copies 911 the file 910 to the src directory 914 under the core view directory 916, which causes a discrete set of epoch files to be created. The file name of the VFS meta-file is core1.xvu 918. The file, core1_debug.xvu 920 is an extended meta-file containing additional aggregations of primitives into files and directories. It may also contain additional timing information. This information may provide a diagnostic engineer more access to the internal structure of an IP core than may otherwise be provided. The epoch files that are created include state_reg.txt 922 and next_state.epoch 924, which are created under the state machine directory 926, which resides under the core1 directory 928 under the module directory 930. The diagnostic engineer may copy the epoch files 922 and 924 to a VFS core view, clock control directory 932, in response to which the VFS configures the DCM(s) accordingly, and thereby advance system time to the specified epoch. The following sequence commands illustrates the copying of the VFS meta-file:

cp core1.xvu /fpga/core/src ls /fpga/core/core1 state_machine/ cp core1_debug.xvu /fpga/core/src ls /fpga/core/core1 state machine/ debug/ ls /fpga/core/core1/state machine state_reg.txt next_state.epoch ls -1 /fpga/core/core1/state_reg.txt -rwxrwxrwx 1 vfs_user dbg_group 100 0.00utc state_reg.txt cp /fpga/core/core1/state/next_state.epoch /fpga/core/core1/debug/clk_ctrl ls -1 /fpga/core/core1/state_reg.txt -rwxrwxrwx 1 vfs_user dbg_group 100 0.10utc state_reg.txt The file state_reg.txt is an aggregation of the flip-flops or LUTs used to hold the state register for a core in the given state machine. The ".xvu" file contains symbolic information used to decode the binary data in the state register to a symbolic value. The ".xvu" file may also have an explicit specification of the epoch data associated with a state transition from one state to another state. The VFS uses that information to create the epoch file.

The epoch file contains an indication of how far into the future the system must be stepped for this state machine to reach its next state. This file has a dynamic behavior because the exact timing to transition to the next state may differ from one state to the next. Using the state machine timing data explicitly encoded in the ".xvu" file, the VFS may actually use a value dependent on the current state value to calculate the changes needed on the clock control circuit. In another embodiment, the state machine may not have such a dynamic "next_state.epoch" file. Instead, it may have explicit epoch files, one for each possible transition. It will then be up to the user to determine if the epoch for given a state transition is valid, based on the current state register value.

The copy of the next_state.epoch has the effect of clocking the state machine forward a specified amount of time. This is reflected in the change in the modification time of the "state_reg.txt" file.

Debug control is created as the ".xvu" file is parsed by the VFS where it is specified as an aggregation of the primitive resources. Symbolic translations for the configuration data may also be specified so that reading the debug control file provides a textual specification of the debug mode i.e. "cycle-stepping" or "free-running".

A benefit of using the VFS for system debug is the capability to interrogate all state elements in a design without requiring explicit signal taps to be routed in the user logic. In one embodiment an automated tool extracts the design hierarchy and the physical locations of the design's state elements to generate the VFS core meta-file (a core1.xvu). The core meta-file maps the design's state elements to the physical elements that implement the state elements. When the .xvu file is copied into the appropriate core view directory, new directories and files are created in the core/module directory of the VFS. The new directories represent the subset of the design hierarchy specified in the .xvu file. The files represent aggregations of physical resources within those regions of the design hierarchy. By reading the contents of the VFS files, a diagnostic engineer may deduce the operating state of the design.

Finite state machines are of particular interest in the debug cycle. Synthesis and mapping tools may make non-trivial transformations to state machine logic. This makes manual specification of the design resources to be aggregated into files of the IP core view a cumbersome and difficult task.

The design flow is extended with the capability to automatically populate the .xvu file with information about the physical layout and encoding of state vectors within the design. This extraction compensates for any transformations that may have occurred between the logical description of the state machine and its physical implementation in FPGA gates. For example, a synthesis tool may re-encode a state machine with a one-hot implementation. The automated tool compensates for this when the .xvu file is generated. The diagnostic engineer still receives the same symbolic state information rather than the obfuscated physical encoding. In a similar manner, the automated tool creates .xvu file entries describing the name and physical location of register and memory blocks in the design. The tool flow hides when the individual bits of the register have been placed in discontinuous regions of the FPGA or if memories specified in the HDL source have been unified or split over multiple physical memory resources. The designer's perception of HDL state symbols, registers and other state elements is maintained. The VFS core view implements the transformations on the physical bitstream data to present the raw data in the correct, symbolic form.

To support determining which registers and resources in the design should be included in the .xvu file and the correct set of symbolic values that should be used when translating raw configuration data, coding guidelines may be used in the specification of the system design. In the most basic scenario, coding guidelines may provide a structure to the design's source code that makes it simpler for the automated flow to parse out the relevant data. Complex designs can include explicit compilation pragmas/constraints that aid the VFS automatic tool flow in extracting the relevant data.

Constraints may also be used to prevent resources from being exported in the .xvu file. For example, it may be desirable to limit the amount of design information a core customer may see through any of the VFS views. Such constraints would have the effect of limiting the number of directories and files introduced in the IP core view. Alternatively, they may explicitly de-populate resources from the physical view when the IP designer does not want that region of their circuit to be available for even physical resource interrogation. Constraints allow the VFS automated tools to generate .xvu entries for resources depending on the credentials of tool user. For example, a diagnostic engineer for a particular core vendor or privileged customer may provide a secure token to the VFS tools, allowing them to generate .xvu files that map additional resources into the VFS. The .xvu files themselves may be encrypted to prevent the release of sensitive system design data. Only inside the VFS would the .xvu file be decrypted and applied.

In extending the debug scenario it may not be possible to conclude that the true location of the fault is in a specific region of the design. In one embodiment, a specialized "debug" version of the hardware circuit may be compiled. The debug version of the circuit would be analogous to compiling a software module with the compiler's debug flag enabled which causes the software to maintain more information about its compute state as it executes. The debug version of a hardware block exhibits a similar property in that extra registers are added to the block to capture additional, intermediate state in the computation. The VFS automatic tool flow presents these additional registers, state elements and debug mode FSMs as extra files and directories at the appropriate locations in the core view. This technique may be combined with a mechanism to swap out the earlier, 'non-debug' version and replace it with the 'debug' version of the core. Furthermore, the physical floor plan of the system being debugged is provisioned with enough resources for the debug version of the core. The system being observed is also changed by this debug strategy. In rare cases this may alter the symptoms or even presence of the error, but in most circumstances it will be acceptable. A specific benefit of the approach is that the amount of design state maintained in the circuitry being examined may be increased and that state may be accessed without affecting the block's signal interfaces. The configuration memory of the underlying FPGA remains the primary conduit to the state data. "Profile mode" circuits—circuits that contain extra logic to capture dynamic performance data during execution—can be implemented using the same technique.

Figure 11:
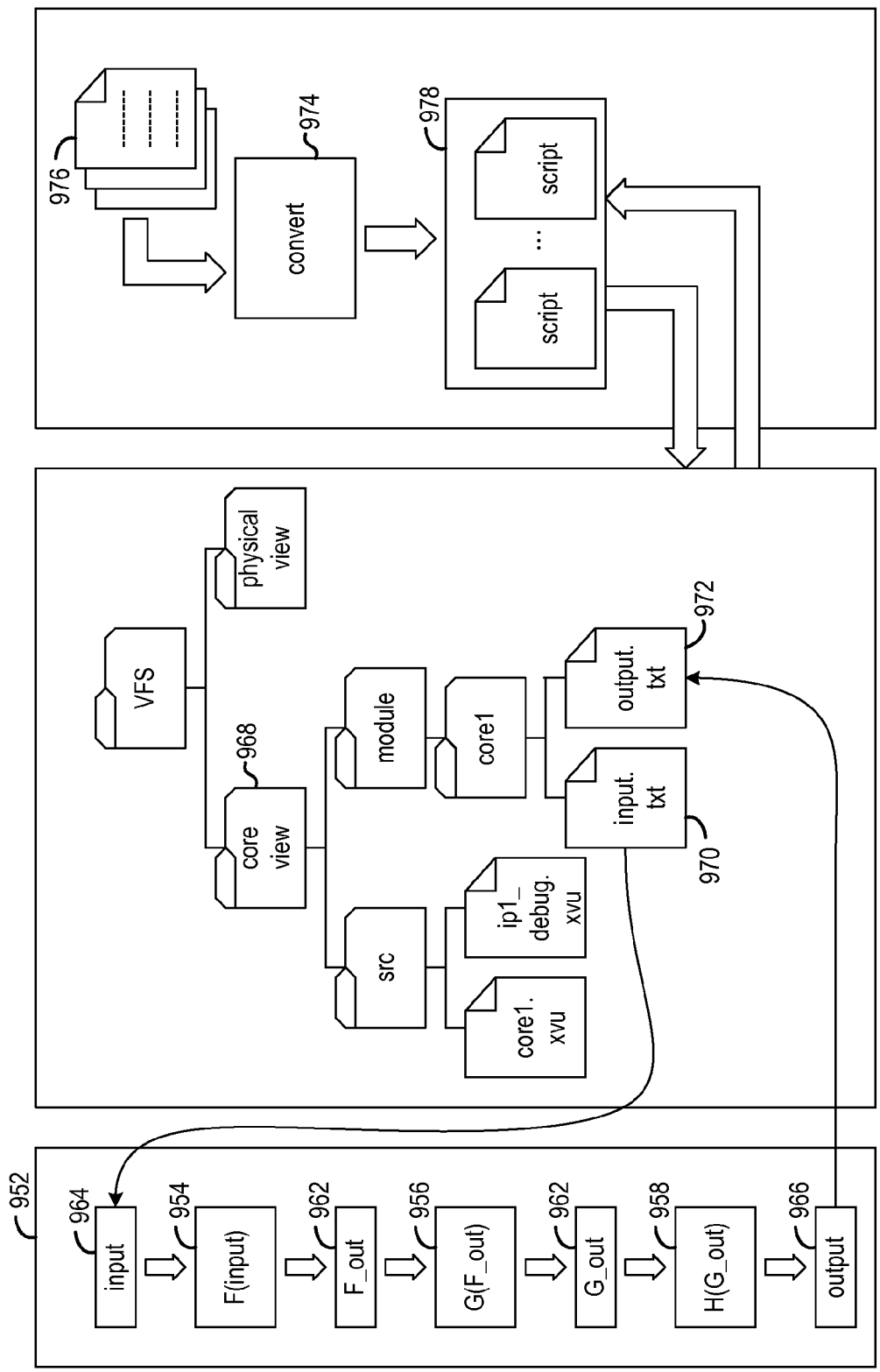
FIG. 11 shows an example design and accompanying data flow in which the VFS may be used to change the state of a design.

In addition observing the state of the system through the VFS, a diagnostic engineer may also desire to alter the state in order to locate a design error. FIG. 11 shows an example design and accompanying data flow in which the VFS may be used to change the state of a design. The example target design 952 includes a pipeline of processes 954, 956, and 958 separated by registers 960 and 962. Registers 964 and 966 are the input and output registers for the design, respectively. The registers at the interface to each pipeline stage are made accessible through files in the core view 968. For example, the engineer may issue a file access command to read from the input.txt file 970, in response to which the VFS reads state data back from the associated physical resources of the PLD and outputs the data as directed by the command. Similarly, the diagnostic engineer may use a file access command to write to the output.txt file 972, which causes the VFS to store the specified data to the associated physical resources of the PLD. The input.txt and output.txt files are created by having the VFS parse a specific ".xvu" file. The particular time at which the files are created will depend on the IP core. The files may be created when the "IP Core" view is first populated or the files may only appear when the diagnostic engineer asks the VFS to parse a special diagnostic ".xvu" file.

To further automate diagnostic testing, core vendors may convert (block 974) test vectors from existing test benches 976 into standard shell scripts 978. These scripts can then stimulate the actual hardware circuit with the appropriate set of test vectors by way of writing to VFS files (line 980). In conjunction with stimulating the circuit, the scripts can monitor the circuit state by way of reading from VFS files (line 982) and highlight which tests fail to produce the correct results at the pipeline output 966 or during the intermediate phases of the computation. The scripts may be categorized to apply different levels of automatic stimulus and diagnosis. For example, the diagnostic engineer may choose to invoke a broad test script that only writes to VFS files representing the top level input and output registers of the block-under-test. Based on the results that are returned, the engineer may select other scripts to apply increasingly focused tests. For example, the more detailed tests may clock the circuit with successively finer granularities and examine the state values accumulated deeper within the design hierarchy.

Various embodiments of the present invention have been described for use with a field programmable gate array (FPGA). Those skilled in the art will appreciate, however, that the invention could be implemented in different FPGA architectures, other types of programmable logic devices (PLDs) other than FPGAs, and integrated circuits that include programmable logic circuitry. In addition, various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for debugging PLDs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for controlling a circuit implemented in an integrated circuit having programmable logic, the method comprising:

maintaining a hierarchy of directories and files in a virtual file system that is registered with an operating system, wherein the directories and files are associated with resources of the programmable logic, wherein the programmable logic includes a plurality of configurable clock management circuits of the programmable logic, each clock management circuit configurable to de-skew an input clock signal and provide an output clock signal from the de-skewed input clock signal, and configurable to change the frequency of an input clock signal and provide the output clock signal at the change frequency, and each file represents a respective data set of configuration data for an associated one of the resources, a plurality of clock control files respectively associated with clock control circuits of the programmable logic and each clock control circuit coupled to a respective one of the configurable clock management circuits;

wherein the operating system executes on a processor, and the processor is coupled to the resources of the programmable logic;

storing a first value in each of the associated clock control circuits in response to a plurality of corresponding invocations of one or more operating system file access commands, each invocation referencing one of the clock control files and specifying the first value; and controlling advancement of each output clock signal from each clock management circuit of the programmable logic in response to the first value stored in the clock control circuits.

2. The method of claim 1, wherein the controlling includes stopping the clock in response to the first value being equal to a first logic level.

3. The method of claim 2, wherein the controlling includes starting the clock in response to the first value being equal to a second logic level.

4. The method of claim 1, wherein the controlling includes advancing the clock signal for a number of cycles specified by the first value.

5. The method of claim 1, wherein the files include a respective file for each clock management circuit, the method further comprising:

storing a second value in the one of the clock management circuits of the programmable logic in response to invocation of an operating system file access command that specifies the second value and that references the file associated with the one of the plurality of clock management circuits; and controlling one of a de-skewing function and frequency change function of the one of the clock management circuits in response to the second value stored in the one of the clock management circuits.

6. The method of claim 1, further comprising:

in response to a plurality of corresponding invocations of one or more operating system file access commands, each invocation referencing one of the clock control files and specifying the first value, for each clock control circuit associated with a referenced clock control file, determining from the first value, a respective cycle count for the output clock signal of the clock management circuit that is coupled to the clock control circuit, wherein two or more of the clock management circuits output respective clock signals having different signal characteristics;

storing the respective cycle counts in the clock control circuits; and advancing each output clock signal by a number of cycles specified by the respective cycle count.

7. The method of claim 1, further comprising:

in response to a file system file access command, copying a timing data file to the hierarchy;

generating, in response to the copying, epoch data files, wherein each epoch data file indicates a respective number of clock cycles by which a respective one of the clock management circuits is to advance the output clock signal in order to reach a next state;

in response to a file system file access command that references the epoch data file, copying the epoch data file to a clock control directory and updating the configuration of the clock control associated with the circuit clock control directory in response to the copying of the epoch data file.

8. The method of claim 1, further comprising:

storing in a meta-file, physical resource information in association with a plurality of state elements of a design implemented by the circuit;

copying the meta-file to the hierarchy in response to a file access command, and in response to the copying, creating one or more files in the hierarchy corresponding to the physical resources of the programmable logic identified by the physical resource information;

reading back state data from the physical resources of the programmable logic identified by the physical resource information in response to a file access command that reads from the one or more files.

9. The method of claim 1, further comprising:

creating a first file in the hierarchy corresponding to a first register in a design implemented by the circuit; and storing a second value in the first register on the programmable logic in response to invocation of an operating system file access command that references the first file and specifies the second value.

10. An apparatus for controlling a circuit implemented in an integrated circuit device having programmable logic, the apparatus comprising:

a processor coupled to the resources of the programmable logic, wherein the programmable logic includes a plurality of configurable clock management circuits of the programmable logic, each clock management circuit configurable to de-skew an input clock signal and provide an output clock signal from the de-skewed input clock signal, and configurable to change the frequency of an input clock signal and provide the output clock signal at the change frequency;

a memory arrangement coupled to the processor and configured with program code that when executed by the processor causes the processor to perform operations including:

maintaining a hierarchy of directories and files in a virtual file system that is registered with an operating system, wherein the directories and files are associated with resources of the integrated circuit device and each file represents a respective data set of configuration data for an associated one of the resources, a plurality of clock control files respectively associated with clock control circuits of the programmable logic and each clock control circuit coupled to a respective one of the configurable clock management circuits;

wherein the operating system executes on the processor;

storing a first value in each of the associated clock control circuits in response to a plurality of corresponding invocations of one or more operating system file access commands, each invocation referencing one of the clock control files and specifying the first value; and controlling advancement of each output clock signal from each clock management circuit of the programmable logic in response to the first value stored in the clock control circuits.

11. An article of manufacture, comprising:
a non-transitory processor-readable storage medium configured with instructions for controlling a circuit implemented in an integrated circuit device having programmable logic, wherein the programmable logic includes a plurality of configurable clock management circuits of the programmable logic, each clock management circuit configurable to de-skew an input clock signal and provide an output clock signal from the de-skewed input clock signal, and configurable to change the frequency of an input clock signal and provide the output clock signal at the changed frequency, the instructions when executed by a processor coupled to the programmable logic, causing the processor to perform the steps including,
  maintaining a hierarchy of directories and files in a virtual file system that is registered with an operating system, wherein the directories and files are associated with resources of the programmable logic and each file represents a respective data set of configuration data for an associated one of the resources, a plurality of clock control files respectively associated with clock control circuits of the programmable logic and each clock control circuit coupled to a respective one of the configurable clock management circuits;
  wherein the operating system executes on the processor;
  storing a first value in each of the associated clock control circuits in response to a plurality of corresponding invocations of one or more operating system file access commands, each invocation referencing one of the clock control files and specifying the first value; and
  controlling advancement of each output clock signal from each clock management circuit of the programmable logic in response to the first value stored in the clock control circuits.

12. The article of manufacture of claim 11, wherein the controlling includes stopping the clock in response to the first value being equal to a first logic level.

13. The article of manufacture of claim 12, wherein the controlling includes stopping the clock in response to the first value being equal to a second logic level.

14. The article of manufacture of claim 11, wherein the controlling includes advancing the clock signal for a number of cycles specified by the first value.

15. The article of manufacture of claim 11, wherein the files include a respective file for each clock management circuit, the steps further comprising:
  storing a second value in the one of the clock management circuits on the integrated circuit device in response to invocation of an operating system file access command that specifies the second value and that references the file associated with the one of the plurality of clock management circuits; and
  controlling one of a de-skewing function and frequency change function of the one of the clock management circuits in response to the second value stored in the one of the clock management circuits.

16. The article of manufacture of claim 11, the steps further comprising:
  in response to a plurality of corresponding invocations of one or more operating system file access commands, each invocation referencing one of the clock control files and specifying the first value, for each clock control circuit associated with a referenced clock control file, determining from the first value, a respective cycle count for the output clock signal of the clock management circuit that is coupled to the clock control circuit, wherein two or more of the clock management circuits output respective clock signals having different signal characteristics;
  storing the respective cycle counts in the clock control circuits; and
  advancing each output clock signal by a number of cycles specified by the respective cycle count.

17. The article of manufacture of claim 11, the steps further comprising:
  in response to a file system file access command, copying a timing data file to the hierarchy;
  generating, in response to the copying, epoch data files, wherein each epoch data file indicates a respective number of clock cycles by which a respective one of the clock management circuits is to advance the output clock signal in order to reach a next state;
  in response to a file system file access command that references the epoch data file, copying the epoch data file to a clock control directory and updating the configuration of the clock control associated with the circuit clock control directory in response to the copying of the epoch data file.

18. The article of manufacture of claim 11, the steps further comprising:
  storing in a meta-file, physical resource information in association with a plurality of state elements of a design implemented by the circuit;
  copying the meta-file to the hierarchy in response to a file access command, and in response to the copying, creating one or more files in the hierarchy corresponding to the physical resources of the programmable logic identified by the physical resource information;
  reading back state data from the physical resources of the programmable logic identified by the physical resource information in response to a file access command that reads from the one or more files.

* * * * *